(12) United States Patent
Ito

(10) Patent No.: US 8,310,858 B2
(45) Date of Patent: Nov. 13, 2012

(54) NONVOLATILE SEMICONDUCTOR MEMORY DEVICE WITH NO DECREASE IN READ MARGIN AND METHOD OF READING THE SAME

(75) Inventor: Hiroshi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 255 days.

(21) Appl. No.: 12/848,487

(22) Filed: Aug. 2, 2010

(65) Prior Publication Data

US 2011/0051495 A1   Mar. 3, 2011

(30) Foreign Application Priority Data

Sep. 1, 2009 (JP) ................................. 2009-201969

(51) Int. Cl.
*G11C 11/00* (2006.01)
(52) U.S. Cl. ... 365/148; 365/174; 365/175; 365/189.07; 365/189.09
(58) Field of Classification Search .................. 365/148, 365/174, 175, 189.07, 189.09
See application file for complete search history.

(56) References Cited

U.S. PATENT DOCUMENTS

| | | | | |
|---|---|---|---|---|
| 5,640,343 A | * | 6/1997 | Gallagher et al. | ............. 365/171 |
| 6,341,084 B2 | * | 1/2002 | Numata et al. | ................ 365/158 |
| 6,937,495 B2 | * | 8/2005 | Scheuerlein | .................. 365/105 |
| 7,245,526 B2 | | 7/2007 | Oh et al. | |
| 7,327,601 B2 | | 2/2008 | Rinerson et al. | |
| 7,372,753 B1 | | 5/2008 | Rinerson et al. | |
| 2011/0228587 A1 | | 9/2011 | Ito | |
| 2012/0069628 A1 | | 3/2012 | Ito | |

FOREIGN PATENT DOCUMENTS

| | | |
|---|---|---|
| JP | 2006-228414 | 8/2006 |
| JP | 4047315 | 11/2007 |

* cited by examiner

*Primary Examiner* — Pho M Luu
*Assistant Examiner* — Thao Bui
(74) *Attorney, Agent, or Firm* — Oblon, Spivak, McClelland, Maier & Neustadt, L.L.P.

(57) ABSTRACT

According to one embodiment, a plurality of memory cells, each composed of a variable-resistance element and a diode, are arranged at the intersections of a plurality of word lines and a plurality of bit lines. The sense amplifier compares a voltage corresponding to current in a memory cell selected from the plurality of memory cells with a reference voltage to detect data read from the selected memory cell. The controller generates the reference voltage according to the logical value of a signal output from the sense amplifier. The controller, before detecting data in the memory cell, adjusts the reference voltage on the basis of current flowing in one of a plurality of bit lines connected to a plurality of memory cells in a half-selected state detected by the sense amplifier.

16 Claims, 3 Drawing Sheets

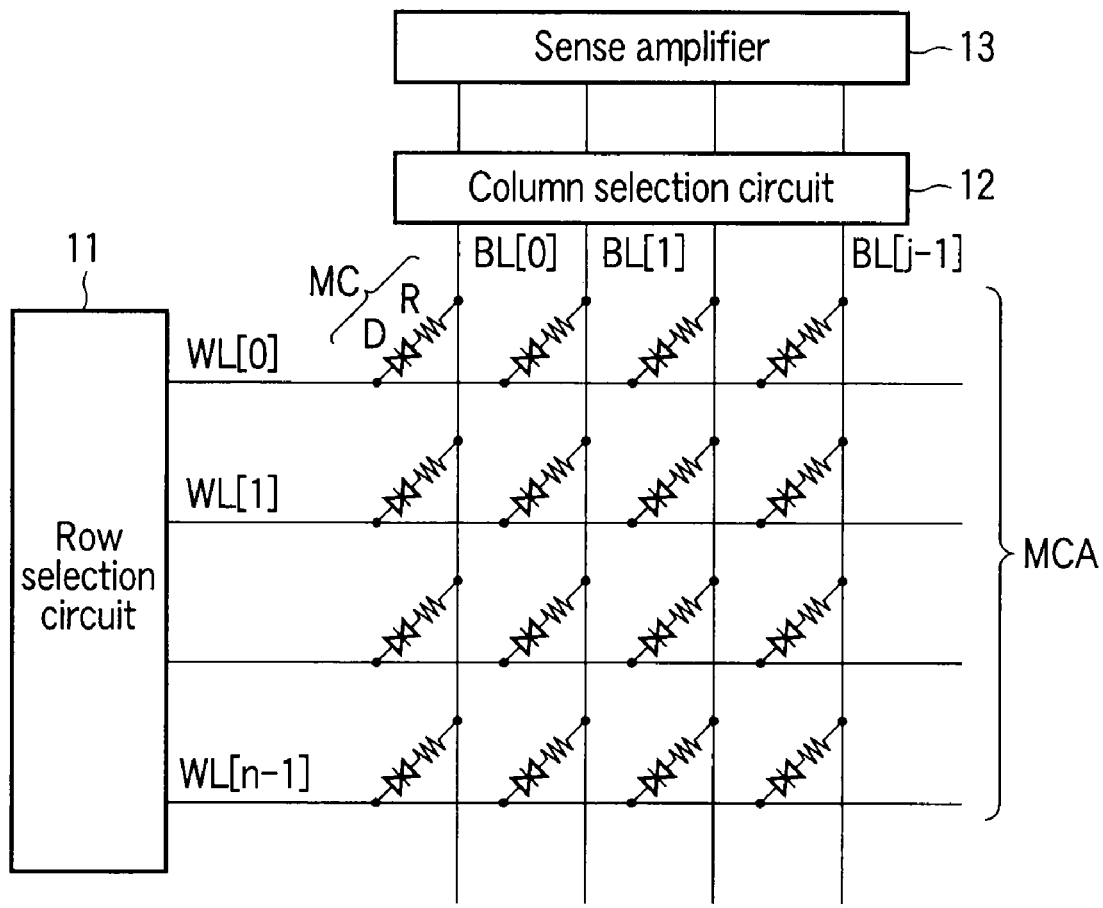
F I G. 1

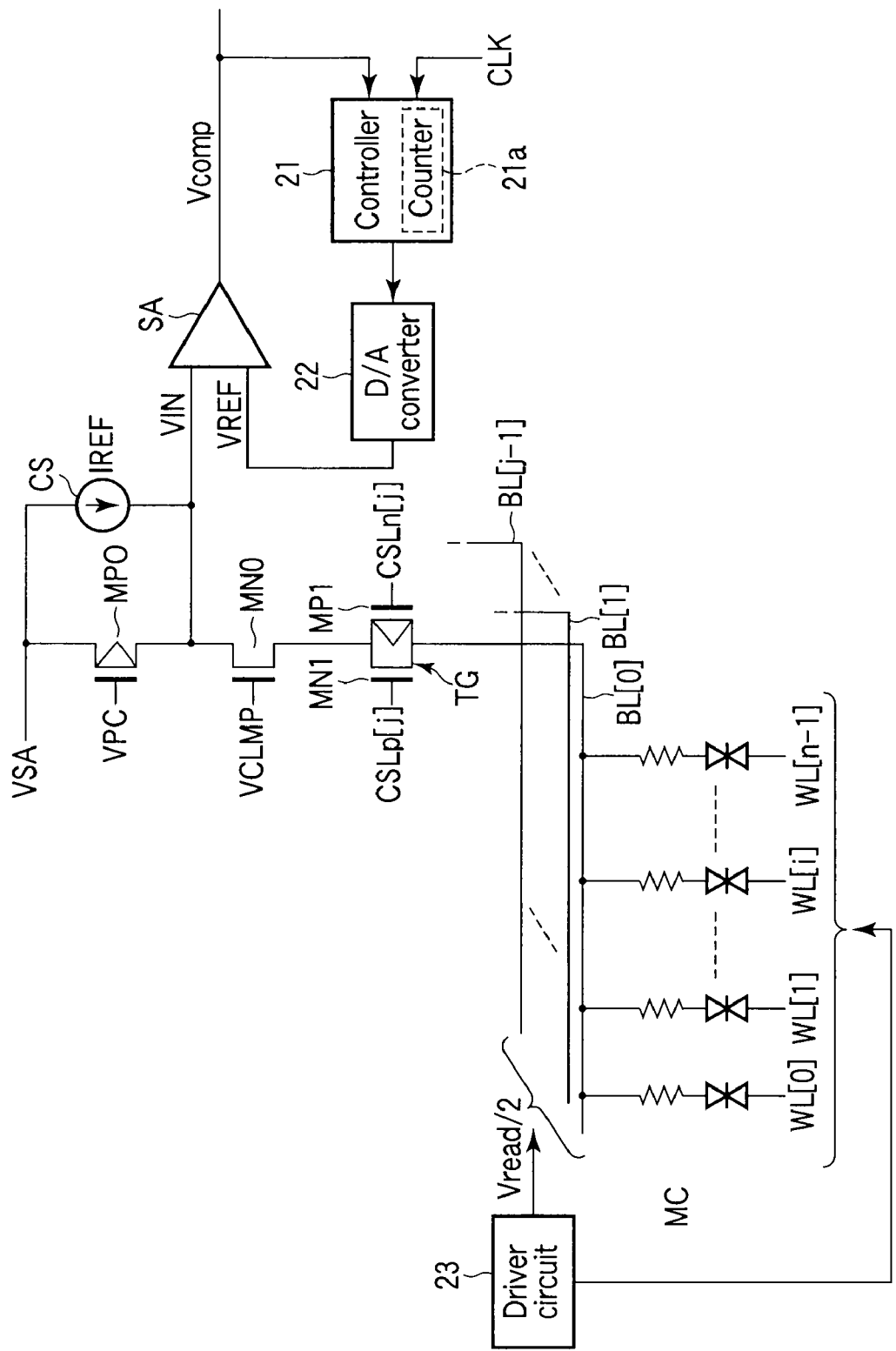
F I G. 2

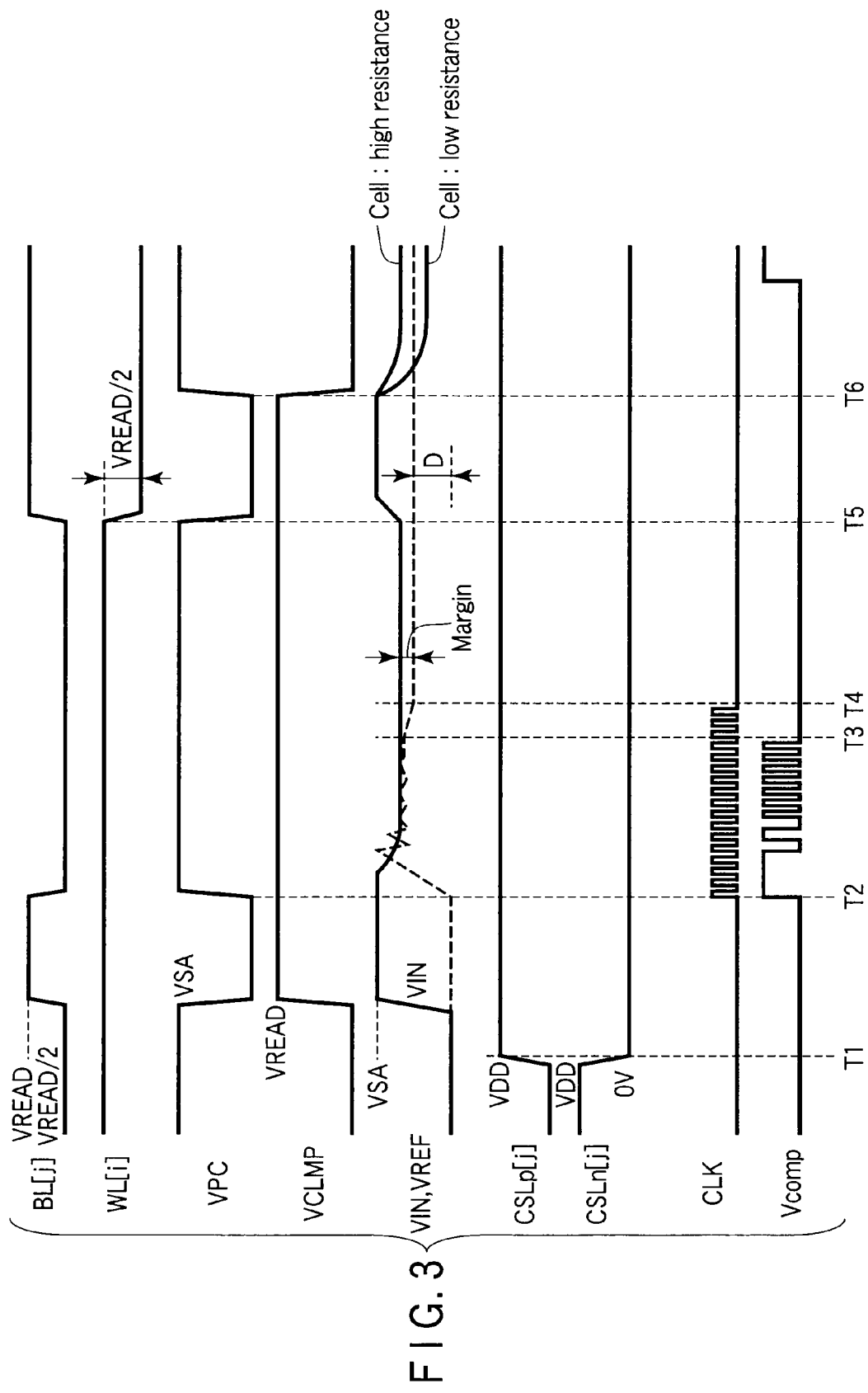
F I G. 3

NONVOLATILE SEMICONDUCTOR MEMORY DEVICE WITH NO DECREASE IN READ MARGIN AND METHOD OF READING THE SAME

CROSS-REFERENCE TO RELATED APPLICATIONS

This application is based upon and claims the benefit of priority from Japanese Patent Application No. 2009-201969, filed Sep. 1, 2009; the entire contents of which are incorporated herein by reference.

FIELD

Embodiments described herein relate generally to a nonvolatile semiconductor memory device with cells each composed of a series connection of, for example, a variable-resistance memory clement and a diode and a method of reading the same.

BACKGROUND

In recent years, nonvolatile semiconductor memory devices using MOS transistors with floating gates as memory elements, such as flash memory, have been widely used in information equipment, home electronics, cars, and the like. NAND flash memory in particular has been taking a lead in achieving larger-capacity memory and miniaturizing memory in place of DRAM. With the miniaturization having reached an advanced stage, however, the following difficulties in memory operations have come to the surface: the difficulty of miniaturizing floating gates and others further, the effect of interference between adjacent cells, and a problem with the reliability of tunnel oxide films. Therefore, near-future physical limits on the technology are seen coming.

To realize memory that surpasses flash memory in miniaturization and storage capacity, memory elements that use new materials and operating principles or memory that uses the technique for a three-dimensional layer stack of cell arrays and the like have been considered. One of these new memories is variable-resistance memory.

As variable-resistance memory, magnetoresistive random access memory (MRAM), phase-change RAM (PRAM), and the like have been proposed. MRAM is a memory that uses the tunnel magnetoresistive effect of a magnetic tunnel junction. PRAM is a memory that uses the following property of a chalocogenide semiconductor: Joule heat produced by current causes a chalcogenide semiconductor to undergo phase transition between a crystal phase and an amorphous phase and the chalcogenide semiconductor has a different resistance in each of the phases.

In recent years, variable-resistance memories using variable-resistance materials and operating principles other than MRAMs and PRAMs have been developed actively. The variable-resistance memory is known as resistive RAM (ReRAM).

One of variable-resistance materials used for ReRAM is metal oxide. Variable-resistance elements using metal oxide are of two types: bipolar and nonpolar. The voltage and current necessary to transit between a low-resistance state and a high-resistance state differ in polarity in the bipolar type and remain unchanged in either polarity in the nonpolar type. A nonpolar variable-resistance element can perform a memory operation in only one direction. Accordingly, it is possible to configure a cross-point cell array where cells, each composed of a series connection of a variable-resistance element and a diode, are arranged at the intersections of word lines and bit lines. The cell area of a cross-point cell using a diode can be decreased and it is easy to cause the cross-point cell to have a three-dimensional structure. Therefore, cross-point cells are suitable for stacking cell arrays to achieve a larger capacity.

A method of reading a cross-point cell array is as follows. Suppose voltage VREAD is applied to memory cells in a read operation.

When a memory operation is not carried out, the word lines and the bit lines are all at 0 V. All the word lines are raised to VREAD, activating a standby state in which a read operation can be performed. At this time, a reverse bias is applied to the diodes of all of the cells. There is reverse bias leakage in a diode. Therefore, imperceptible reverse current flows in each cell. When the number of cells included in the cell array is large, the sum of leakage currents occupies a large proportion of the consumption current of the entire memory.

When a specific cell is read, the selected word line is dropped from VREAD to 0 V and the selected bit line is set at VREAD. Since VREAD is applied to the cell at the interconnection of the selected word line and selected bit line, current corresponding to the resistance of the resistance element flows.

The both ends of each of the cells on the selected word line excluding the selected cell are at 0 V and the both ends of each of the cells on the bit line excluding the selected cell are at VREAD. Therefore, the potential difference between both ends of each of those half-selected cells (cells of which one of the word line and bit line connected to the cell is selected state and the other is unselected state) is 0 V, with the result that no current flows. In a read operation, too, a reverse bias of VREAD is applied to the unselected cells excluding the half-selected cells, which permits reverse leakage current to flow. The sum of the leakage currents contributes to consumption current.

Such a method of applying a voltage to the cell array can eliminate the effect of half-selected cells in reading the selected cell, enabling a wider read operation margin. However, this causes the problem of increasing leakage current. As a result, the size of the cell array cannot be made larger. Moreover, in a read operation, the number of cell arrays activated at the same time is limited and therefore the band width cannot be increased.

If a diode constituting a cross-point cell is defective and the word line and bit line are short-circuited, an unselected reverse bias state is produced and therefore current cannot be limited, resulting in a significant increase in the consumption current. If such a short circuit occurs, there is a possibility that the entire cell array cannot be read.

Another method of applying a word line voltage and a bit line voltage is as follows. When a memory operation is not performed, the word lines and bit lines are all set at 0 V. In the standby state, VREAD/2 is applied to all the word lines and all the bit lines. At this time, the voltage applied between the both ends of each of all the cells is 0 V and therefore no leakage current flows.

When a specific cell is read, the selected word line is set at 0 V and the selected bit line is set at VREAD. At this time, a selected word line voltage of 0 V and an unselected bit line voltage of VREAD/2 are applied to the half-selected cells on the selected word line and an unselected word line voltage of VREAD/2 and a selected bit line voltage of VREAD are applied to the half-selected cells on the selected bit line. That is, a forward bias of VREAD/2 is applied to the half-selected cells. If the nonlinearity of the current characteristic of the diode is strong and current with a forward bias of VREAD/2 is sufficiently smaller than that with a forward bias of VREAD, data in the selected cell can be read with a sufficient margin. Since both the word line voltage and bit line voltage are VREAD/2 in the unselected cells, no current flows.

In this method of controlling the word line voltage and bit line voltage, leakage current flowing in the unselected cells is small and therefore many cell arrays can be activated at the same time. Consequently, the band width can be increased.

However, in this method, the bias to the half-selected cells is not at 0 V. Therefore, if the number of half-selected cells becomes larger, the sum of their currents also becomes larger, decreasing the read margin. Accordingly, it is difficult to make the size of the cell array larger, decreasing the cell occupancy, which causes the problem of increasing the chip area.

Therefore, it has been hoped that a nonvolatile semiconductor memory device capable of preventing a decrease in the read margin of a variable-resistance element using a VREAD/2 bias method and a method of reading the same will be developed.

As for the related art, a memory device has been developed which monitors leakage current in the unselected cells (not cross-point cells) at the time of precharging, holds information temporarily in a capacitor, and cancels the leakage current on the basis of the held information in a read operation (refer to, e.g., Jpn. Pat. Appln. KOKAI Publication No. 2006-228414).

In addition, a memory device has been developed which measures and compensates for leakage current in the unselected memory elements (cross-point cells) and then measures current in the selected memory element (refer to, e.g., Jpn. Pat. No. 4047315).

BRIEF DESCRIPTION OF THE DRAWINGS

FIG. 1 is a circuit diagram schematically showing the configuration of an embodiment;

FIG. 2 is a circuit diagram showing the configuration of a part of FIG. 1; and

FIG. 3 is a waveform diagram to explain an operation of FIG. 2.

DETAILED DESCRIPTION

In general, according to one embodiment, a nonvolatile semiconductor memory device includes a memory cell, a sense amplifier, and a controller. A plurality of memory cells, each composed of a variable-resistance element and a diode, are arranged at the intersections of a plurality of word lines and a plurality of bit lines. The sense amplifier compares a voltage corresponding to current in a memory cell selected from the plurality of memory cells with a reference voltage to detect data read from the selected memory cell. The controller generates the reference voltage according to the logical value of a signal output from the sense amplifier. The controller, before detecting data in the memory cell, adjusts the reference voltage on the basis of current flowing in one of a plurality of bit lines connected to a plurality of memory cells in a half-selected state detected by the sense amplifier.

Hereinafter, an embodiment will be explained with referring to the accompanying drawings.

In FIG. 1, a memory cell array MCA includes a plurality of memory cells MC arranged in a matrix. Each of the memory cells MC is composed of a variable-resistance memory element R and a diode D connected in series with the memory element R. The memory cells MC are arranged at the intersections of an n number of word lines WL[i] (i=0, 1, ..., n−1) and a j number of bit lines BL[j] (j=0, 1, ..., j−1), thereby configuring cross-point cells. Word line WL[i] is selected by a row select circuit 11 and bit line BL[j] is selected by a column select circuit 12. A sense amplifier 13, which is connected to bit line BL[j], detects data in a memory cell read onto the selected bit line.

FIG. 2 shows a part of the memory cell array MCA, column select circuit 12, and sense amplifier 13.

In FIG. 2, bit line BL[j] of the memory cell array MCA is connected to one end of a CMOS transfer gate TG constituting the column select circuit 12. The transfer gate TG is composed of an n-channel MOS transistor MN1 and a p-channel MOS transistor MP1. Column select signals CSLn[j], CSLp[j] which have complementary levels are supplied to the gates of the transistors MN1 and MP1, respectively. The other end of the transfer gate TG is connected not only to one input terminal of a sense amplifier SA via a clamp n-channel MOS transistor MN0 but also to a node to which voltage VSA is supplied via p-channel MOS transistor MP0. Clamp voltage VCLMP is supplied to the gate of transistor MN0. Transistor MN0 clamps the voltage of the bit line to VREAD. Signal VPC is supplied to the gate of transistor MP0. Transistor MP0 precharges the bit line to VSA according to signal VPC. A current source CS for supplying reference current IREF is connected in parallel with transistor MP0.

The output end of an analog-digital (A/D) converter 22 is connected to the other input terminal of the sense amplifier SA. The sense amplifier SA compares reference voltage VREF supplied from the A/D converter 22 with voltage VIN read onto bit line BL[j]. Voltage Vcomp output at the output terminal of the sense amplifier SA is supplied to a controller 21. The controller 21 includes, for example, an up-down counter 21a constituting a digital signal generating module. The counter 21a counts a clock signal CLK and outputs, for example, a k-bit digital signal D[k−1, ..., 0]. In addition, the counter 21a controls the operation of the counter 12a according to the logical value of output voltage Vcomp of the sense amplifier SA. That is, when the logical value of Vcomp output from the sense amplifier SA is "0", digital signal D is incremented by 1 on the rising edge of clock signal CLK. When the logical value of Vcomp is "1", digital signal D is decremented by 1 on the rising edge of clock signal CLK. Digital signal D is not only stored in the controller 21 but also supplied to the D/A converter 22. The A/D converter 22 converts a digital signal supplied from the counter 21a into an analog reference voltage VREF.

When reading the memory cell MC of which a variable-resistance element R and a diode D are connected in series, the memory device of the embodiment sets bit line BL at read voltage VREAD before activating word line WL of the selected cell, detects the effect of current flowing in the unselected cells, and sets and stores a reference voltage of the sense amplifier. Thereafter, on the basis of the stored reference voltage, the voltage read from the selected cell is detected by the sense amplifier.

Hereinafter, the operation of the circuit shown in FIG. 1 will be explained concretely with reference to FIG. 3.

First, a driver circuit 23 shown in FIG. 2 applies voltage VREAD/2 as an nonselective bias to all the word lines and all the bit lines. Consequently, the word lines and bit lines are precharged to VREAD/2. At this time, voltage VPC applied to the gate of transistor MP0 is made high and voltage VCLMP applied to the gate of transistor MN0 is made low, turning off transistors MP0 and MN0.

Thereafter, at time T1, column select signals CSLp[j], CSLn[j] are set at VDD and 0 V, respectively, turning on the transfer gate TG. Thereafter, clamp voltage VCLMP is supplied to the gate of transistor MN0, and turning on transistor MN0, which connects bit line BL[j] to the sense amplifier SA. In addition, signal VPC is changed from VSA to 0 V, precharging one input terminal of sense amplifier SA from voltage VIN to VSA. Then, current flows from sense amplifier SA to bit line BL[j], raising the voltage of bit line BL[j]. At this time, clamp voltage VCLMP is set, causing clamp transistor MN0 to clamp the voltage of bit line BL[j] to VREAD=VCLMP−Vt (where Vt is the threshold voltage of n-channel MOS transistor). The voltages of all the word lines are kept at VREAD/2. Consequently, all the cells on bit line BL[j] are in the half-selected state, with the result that the sum of currents according to the diode characteristics of the individual cells flows in bit line BL[j]. Suppose the bit line current at this time is I0.

Thereafter, at time T2, signal VPC is set at VSA, turning off transistor MP0, which cancels precharging. Then, voltage VIN at one input terminal of sense amplifier SA is discharged by current I0 in the bit line, which lowers the voltage. At this time, reference current IREF flows from VSA to VIN via the current source CS. Reference current IREF flows according to the potential difference between VSA and VIN (VSA−VIN).

The controller 21 is operated by clock signal CLK at the same time that VSA cancels the precharging of bit line BL[j], causing the counter 21a to count clock signal CLK and output digital signal D. The D/A converter 22 converts digital signal D into reference voltage VREF.

Sense amplifier SA compares VREF shown by a broken line in FIG. 3 with VIN and outputs output signal Vcomp. A counter 22a increments or decrements the digital signal by one according to the logical value of output signal Vcomp, that is, count up or down the digital signal. Digital signal D is converted into reference voltage VREF by the D/A converter 22. Reference voltage VREF is compared with VIN at sense amplifier SA.

Such operations are repeated. After VIN coincides with reference voltage VREF at time T3, the counter 22a counts down the value of digital signal D by, for example, several cycles, regardless of the magnitude of Vcomp to secure a margin (time T4). That is, VIN is a voltage including the effect of current when all the cells on the bit line are in the half-selected state. If one of the cells goes into the selected state, the cell current increases and the voltage drops. If the selected cell is in a high-resistance state, a drop in the voltage is small. If the selected cell is in a low-resistance state, a drop in the voltage is large. Therefore, VREF is made lower than this voltage, thereby setting the value of digital signal D so that VREF may lie almost midway between a voltage corresponding to data on the high resistance stored in the selected cell and a voltage corresponding to data on the low resistance. The value is held in the counter 22a.

Next, at time T5, signal VPC is set at 0 V again, turning on transistor MP0, which precharges one input terminal of sense amplifier SA from voltage VIN to VSA. At the same time, the selected word line WL[i] is set at 0 V.

At time T6, signal VPC is set at VSA, canceling the precharging of bit line BL[j], which causes a bias of VREAD to be applied to the selected cell. Consequently, cell current Icell flows. At this time, the sum of bit line currents is expressed by the following expression:

I0+Icell(VREAD)−Icell(VREAD/2)

where I0 is the sum of currents in the half-selected cells, Icell(VREAD) is current in the selected cell, and Icell(VREAD/2) is current in a half-selected cell.

Accordingly, if the selected cell is in the low resistance state, ΔIcell (=Icell(VREAD)−Icell(VREAD/2)) is large and VIN drops significantly. If the selected cell is in the high-resistance state, ΔIcell is small and VIN drops slightly.

Reference voltage VREF is adjusted so as to eliminate the effect of I0. Therefore, sense amplifier SA can determine with a sufficient margin whether the selected cell is in the low-resistance state or the high-resistance state. Sense amplifier SA can read the storage state of the selected cell in the form of output signal Vcomp with a logical value of "0" or "1". With the embodiment, before reading, the effect of bit line current generated by the unselected cells is detected to adjust reference voltage VREF of sense amplifier SA in a state where a voltage of VREAD/2 is applied to all the bit lines and all the word lines and the storage state (data) of the selected cell is detected using the adjusted reference voltage VREF. Since reference voltage VREF does not include the effect of bit line current generated by the unselected cells, the storage state of the selected cell can be read with a sufficient margin. Therefore, leakage current in the unselected cells can be suppressed using the VREAD/2 bias method capable of suppressing consumption current in the cross-point cell array and many memory cell arrays can be operated in parallel.

In addition, the effect of current in the half-selected cells can be cancelled by adjusting reference voltage VREF of sense amplifier SA on a selected bit line basis, which enables a larger array size to be realized. Accordingly, a ReRAM with a very wide read band and a small chip size can be realized.

Furthermore, the controller 21 decreases the value of digital signal D from when the output voltage of sense amplifier SA has gone to zero until a specific period has elapsed, thereby generating digital signal D from which the effect of bit line current generated by the unselected cells has been removed. Consequently, digital signal D from which the effect of bit line current generated by the unselected cells can be generated accurately and reliably.

While the controller 21 has generated digital signal D with the up-down counter 21a, the embodiment is not limited to this. For instance, the controller 21 may be composed of an adder and a memory or a register.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a plurality of memory cells which are arranged at the intersections of a plurality of word lines and a plurality of bit lines and each of which includes a variable-resistance element and a diode;
a sense amplifier which compares a voltage corresponding to current in a memory cell selected from said plurality of memory cells with a reference voltage to detect data read from the selected memory cell; and
a controller which generates the reference voltage according to the logical value of a signal output from the sense amplifier and which, before detecting data in the memory cell, adjusts the reference voltage on the basis of current flowing in one of said plurality of bit lines connected to said plurality of memory cells in a half-selected state detected by the sense amplifier.

2. The device according to claim 1, further comprising:
a voltage application module which applies half a read voltage to the word lines and the bit lines when the controller adjusts the reference voltage.

3. The device according to claim 2,
wherein the voltage application module, when reading a memory cell, applies the read voltage to the selected bit line and a voltage lower than half the read voltage to the selected word line.

4. The device according to claim 1,
wherein the reference voltage is set to a third voltage between a first voltage corresponding to data on a high resistance stored in the memory cell and a second voltage corresponding to data on a low resistance.

5. The device according to claim 1,
wherein the controller comprises:
a digital signal generator circuit which generates a digital signal according to the logical value of a signal output from the sense amplifier; and
a digital-to-analog converter which converts a digital signal generated by the digital signal generator circuit into the reference voltage.

6. The device according to claim 5,
wherein the digital signal generator circuit includes a counter which counts up or down the digital signal according to the logical value of a signal output from the sense amplifier.

7. The device according to claim 6,
wherein the controller causes the counter to count down from when the output signal of the sense amplifier has gone to "0" until a certain period of time has elapsed.

8. A nonvolatile semiconductor memory device comprising:
a plurality of memory cells which are arranged at the intersections of a plurality of word lines and a plurality of bit lines and each of which includes a variable-resistance element and a diode;
a sense amplifier which is connected to the selected bit line and which compares a voltage corresponding to current flowing in the selected memory cell with a reference voltage to detect data read from the memory cell; and
a controller which, before reading the memory cell, adjusts the reference voltage according to the logical value of a signal output from the sense amplifier and which adjust the reference voltage in a state where half a read voltage is applied to said plurality of bit lines and said plurality of word lines.

9. The device according to claim 8, further comprising:
a voltage application module which applies half the read voltage to the word lines and the bit lines when the controller adjusts the reference voltage.

10. The device according to claim 9,
wherein the voltage application module, when reading a memory cell, applies the read voltage to the selected bit line and a voltage lower than half the read voltage to the selected word line.

11. The device according to claim 10,
wherein the reference voltage is set to a third voltage between a first voltage corresponding to data on a high resistance stored in the memory cell and a second voltage corresponding to data on a low resistance.

12. The device according to claim 8,
wherein the controller includes a counter which counts up or down according to the logical value of a signal output from the sense amplifier.

13. The device according to claim 12,
wherein the controller causes the counter to count down from when the output signal of the sense amplifier has gone to "0" until a certain period of time has elapsed.

14. A method of reading a nonvolatile semiconductor memory device, the method comprising:
applying half a read voltage to a plurality of bit lines and a plurality of word lines to set a plurality of memory cells in a half-selected state before reading, each of said plurality of memory cells including a variable-resistance element and a diode;
comparing a voltage corresponding to current flowing in a bit line connected to a memory cell in the half-selected state with a reference voltage to generate an adjusted reference voltage; and
comparing a voltage corresponding to current flowing in the selected memory cell with the adjusted reference voltage to read the selected memory cell.

15. The method according to claim 14, wherein the adjusted reference voltage is set to a third voltage between a first voltage corresponding to data on a high resistance stored in the memory cell and a second voltage corresponding to data on a low resistance.

16. The method according to claim 14, further comprising:
applying the read voltage to the selected bit line and a voltage lower than half the read voltage to the selected word line when reading a memory cell.

* * * * *